United States Patent
Yeh (10) Patent No.: US 8,248,375 B2
(45) Date of Patent: Aug. 21, 2012

(54) INPUT DEVICE FOR COMPLEX CONTROL SIGNAL

(75) Inventor: Wang-Hung Yeh, Taoyuan (TW)

(73) Assignee: FIH (Hong Kong) Limited, Cheung Sha Wan, Kowloon, Hong ( * ) Notice: Subject to any disclaimer, the term of this patent is extended or adjusted under 35 U.S.C. 154(b) by 1198 days.

(21) Appl. No.: 12/045,779

(22) Filed: Mar. 11, 2008

(65) Prior Publication Data
US 2009/0231019 A1    Sep. 17, 2009

(51) Int. Cl.
*G09G 5/00* (2006.01)
(52) U.S. Cl. ............ 345/173; 345/169; 178/18.01
(58) Field of Classification Search .......... 345/156, 345/173, 169; 178/18.01, 18.02–18.09
See application file for complete search history.

(56) References Cited

U.S. PATENT DOCUMENTS
7,084,859 B1 * 8/2006 Pryor ............... 345/173
2008/0238879 A1 * 10/2008 Jaeger et al. .......... 345/173

FOREIGN PATENT DOCUMENTS
CN    1815410 A    8/2006
* cited by examiner

*Primary Examiner* — Abbas Abdulselam
(74) *Attorney, Agent, or Firm* — Altis Law Group, Inc.

(57) ABSTRACT

An input device for a multiplex control signal is applied to provide one or more input position(s) for a user, where each input position generates a plurality of control signals corresponding to a plurality of input states, and an output control unit determines the output of the control signals from each the same input position according a time parameter.

13 Claims, 10 Drawing Sheets

INPUT DEVICE FOR COMPLEX CONTROL SIGNAL

BACKGROUND OF THE INVENTION

1. Field of Invention

The present invention relates to an input device for an electronic device, in particular, to an input device for a multiplex control signal.

2. Related Art

There are generally two types of input devices, namely, touch type and button type used in electronic devices, e.g. personal computers (PC), notebook computers, table PCs, mobile phones, personal digital assistants (PDA), smart phones, navigation devices, or machines with human-machine interfaces.

For a notebook computer, two input devices, i.e., a touchpad and a keyboard, are simultaneously disposed on the current notebook computer, for providing multiple input modes. The user can slide finger on the touchpad, and at this time the movement direction of the finger is the movement direction of the mouse pointer on the liquid crystal display (LCD). The user can input words, numerals, signs through the keyboard. However, the two input devices, i.e. the touchpad and the keyboard are disposed on the notebook computer in a separate manner, thus wasting much space.

Accordingly, for electronic devices in need of small volumes, e.g. table PCs, mobile phones, personal digital assistants (PDA), smart phones, and navigation devices, only one single input device (touchpad or keyboard) is provided. However, in order to achieve multiple functional services, the input operation is very complex.

For an electronic device merely provided with touchpad as an input device, the touchpad must be used together with software or firmware. Moreover, most kinds of touchpad can merely provide click control or control of movement of the mouse pointer. Words/signs must be input though the software (for example, handwriting input software or on-screen keyboard).

However, for electronic devices only provided with the button input function, each button can only provide one signal control. When the execution of different instructions is controlled by a single button, it is necessary to switch the input mode, so as to switch the executive instructions generated by the button. For example, the first button may input numerals or English letters or signs, and the second button may switch the input mode. When the user selects the numeral input mode with the second button, he/she presses the first button to input the corresponding numeral. Similarly, when the user selects the English letter input mode with the second button, he/she presses the first button to input the corresponding English letter. When the user selects the sign input mode with the second button, he/she presses the first button to input the corresponding sign.

SUMMARY OF THE INVENTION

Accordingly, the present invention is directed to an input device for a multiplex control signal, capable of generating a plurality of control signals corresponding to one or more input position(s) respectively.

A light diffuser according to the present invention includes a touch control unit, a mechanical control unit, and an output control unit.

The mechanical control unit and the touch control unit are overlapped at all the input positions. Further, the touch control unit and the mechanical control unit are electrically connected to the output control unit, so as to transfer the outputs to the output control unit.

The touch control unit generates a first control signal corresponding to the control state of each input position.

The mechanical control unit has one or more button(s). Each button is corresponding to an input position, and generates a second control signal corresponding to the press state of the corresponding input position.

The output control unit is capable of receiving the first control signal from the touch control unit and the second control signal from the mechanical control unit, and determines the output of the first control signal and the second control signal from the same input position according to a time parameter.

When the output control unit receives the first control signal and the second control signal from the same input position within a time parameter, the output control unit outputs the received second control signal. When the output control unit only receives the first control signal from the same input position within a time parameter, the output control unit outputs the received first control signal.

In view of the above, the input device for a multiplex control signal of the present invention generates a plurality of control signals corresponding to one or more input position(s) respectively, and each input position generates a plurality of control signals corresponding to the input state. In other words, the input device for a multiplex control signal of the present invention can respond a single press and generate one or more signal(s) according to the input state. Therefore, the user can control the extent of pressing as required, so as to achieve the input of different signals. In this manner, when the variation of the control action of each input button increases, the complexity of the input operation and the system will not increase, and the input speed of the user is increased.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1A:
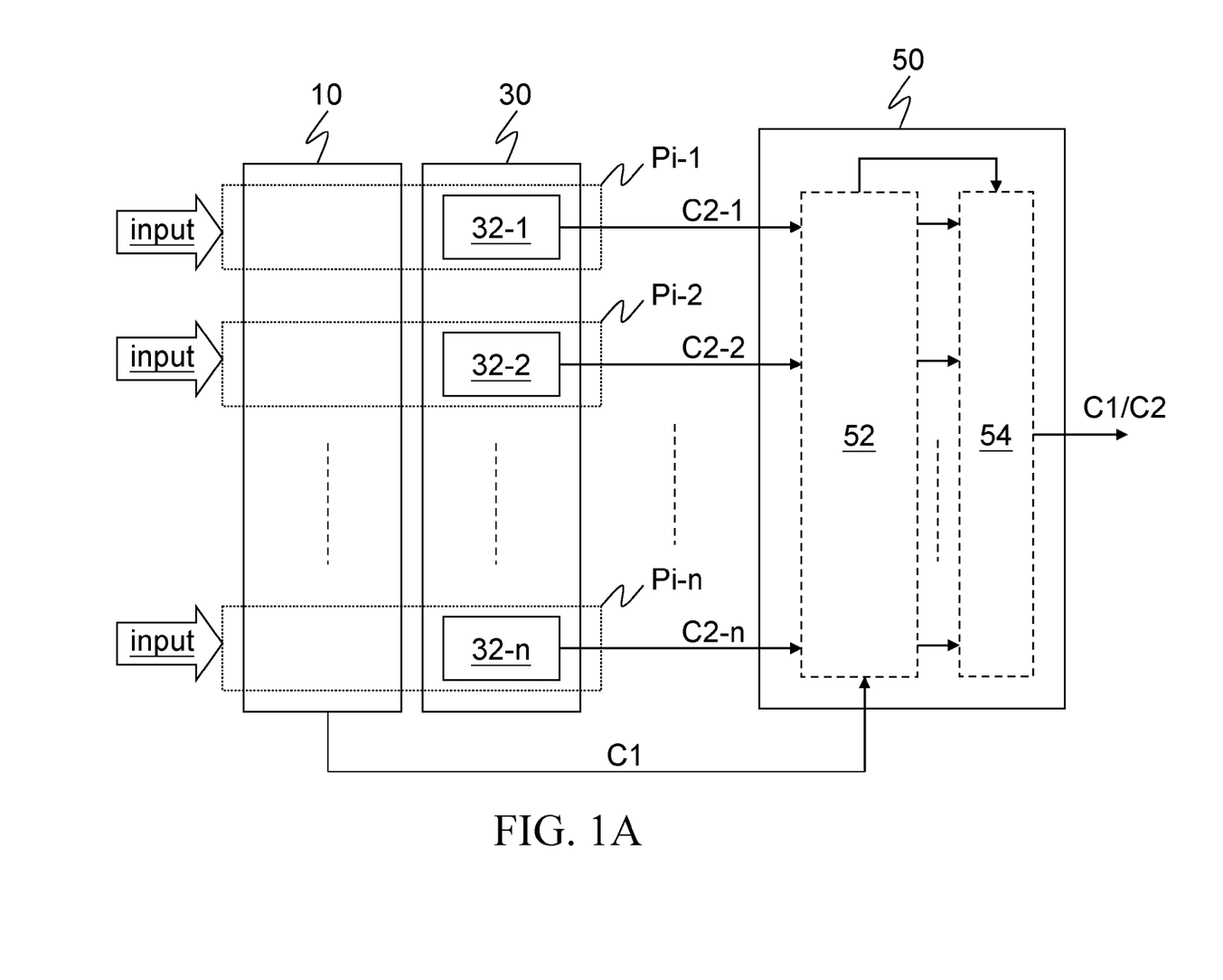
FIG. 1A is a brief schematic view of an input device for a multiplex control signal according to an embodiment of the present invention.
Figure 1B:
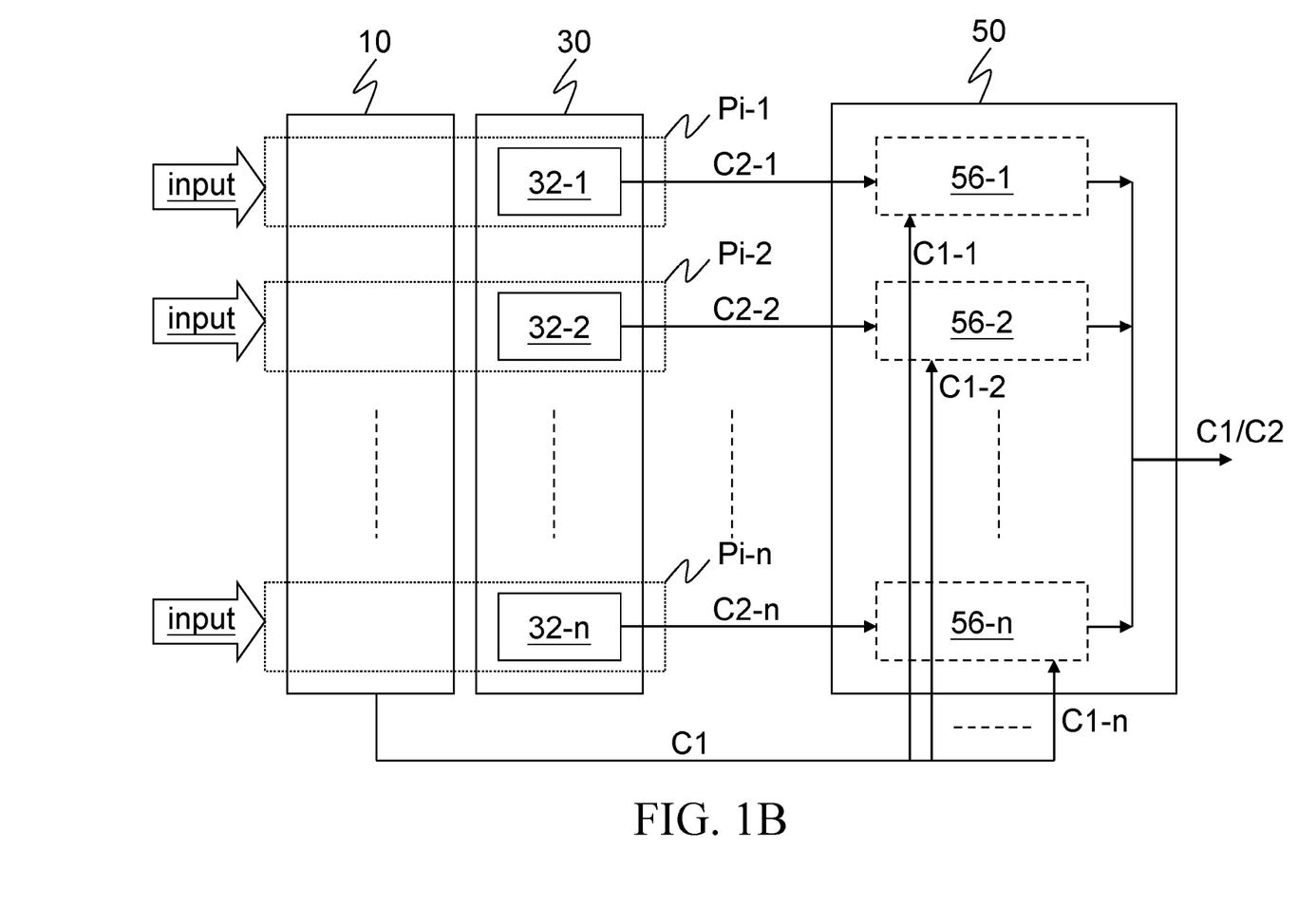
FIG. 1B is a brief schematic view of an input device for a multiplex control signal according to another embodiment of the present invention.
Figure 2:
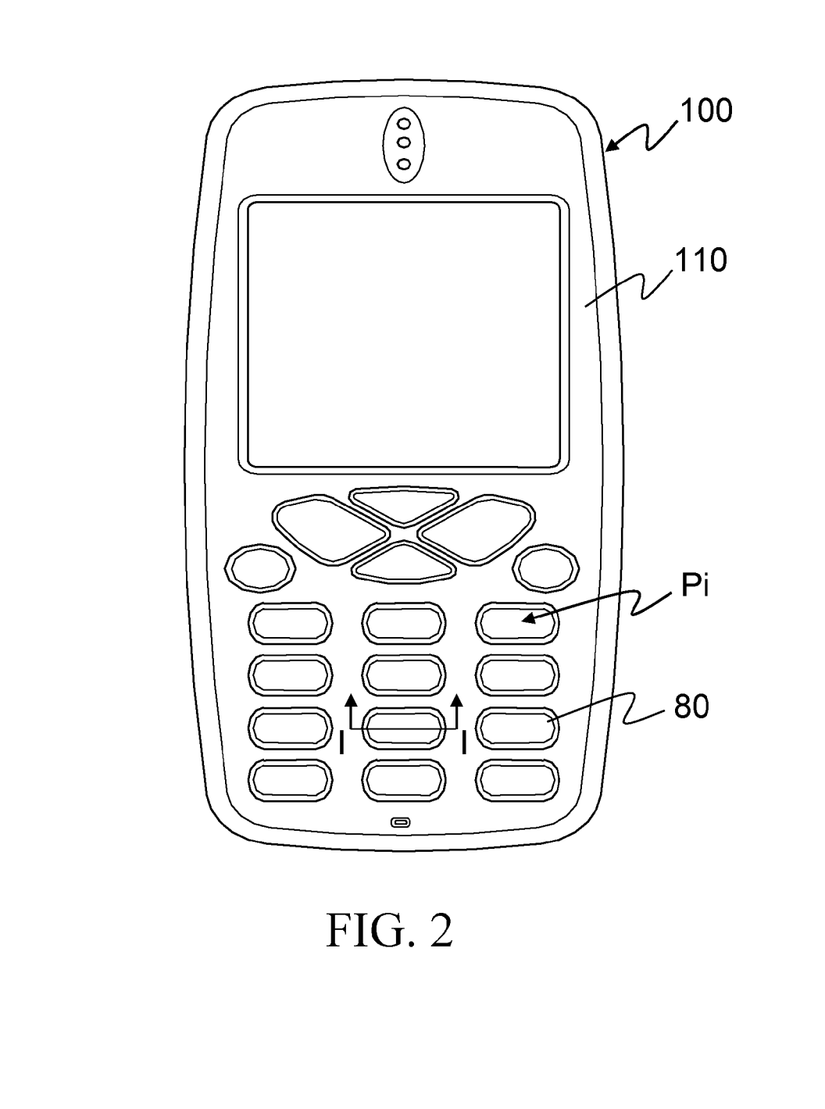
FIG. 2 is a schematic view showing appearance of an electronic device adopting the input device for a multiplex control signal according to an embodiment of the present invention.

FIGS. 1A and 1B are schematic views of an input device for a multiplex control signal of the present invention. FIG. 2 is a schematic view showing an appearance of an input device for a multiplex control signal according to an embodiment of the present invention.

Referring to FIGS. 1A, 1B, and 2, the input device for a multiplex control signal includes a touch control unit 10, a mechanical control unit 30, and an output control unit 50.

The input device for a multiplex control signal provides a user one or more input position(s) Pi-1, Pi-2 . . . Pi-n (generally referred to as input position Pi in this embodiment). Each input position Pi is corresponding to a plurality of input states, for example, touch state and press state, so as to generating a plurality of control signals, for example, a first control signal C1 (the general name of first control signals C1-1, C1-2 . . . C1-n in this embodiment) and a second control signal C2 (the general name of second control signals C2-1, C2-2 . . . C2-n in this embodiment). For example, at a same input position Pi-1, the input device for a multiplex control signal generates a first control signal C1-1 when the user touch the input position Pi-1 (in this embodiment, the input state input refers to the touch state), and generates a second control signal C2-1 when the user press the input position Pi-1 (in this embodiment, the input state refers input refers to the press state). Thus, two control signals (i.e., the first control signal C1-1 and the second control signal C2-1) are generated corresponding to the same input position Pi-1.

Here, the touch control unit 10 and the mechanical control unit 30 are overlapped at all the input position Pi. Further, the touch control unit 10 and the mechanical control unit 30 are electrically connected to the output control unit 50 to transfer the output (i.e. the first control signal C1 and the second control signal C2 in this embodiment) to the output control unit 50.

The touch control unit 10 generates the first control signal C1 corresponding to the touch state of the input position Pi.

The mechanical control unit 30 has one or more button(s) 32-1, 32-2 . . . 32-n (generally called as button 32 in this embodiment). Each button 32 is corresponding to an input position Pi and generates a second control signal C2 corresponding to the press state of the corresponding input position Pi.

The output control unit 50 receives the first control signal C1 from the touch control unit 10 and the second control signal C2 from the mechanical control unit 30, and determines the output of the first control signal C1 and the second control signal C2 from the same input position Pi according to a time parameter.

For example, when the output control unit 50 receives the first control signal C1 and the second control signal C2 from the same input position Pi within the time parameter, the output control unit 50 outputs the received second control signal C2. When the output control unit 50 merely receives the first control signal C1 from the same input position Pi within the time parameter, the output control unit 50 outputs the received first control signal C1.

In brief, if the time parameter is 1 second, when the user uses the finger to input at the input position Pi-1, the touch control unit 10 responds to the finger touch at the input position Pi-1 and generates the first control signal C1-1. At this time, the output control unit 50 detects the second control signal C2-1 from the same input position Pi-1 in 1 second after receiving the first control signal C1-1, so as to confirm whether the second control signal C2-1 is received or not. If the finger continues pressing downwardly after touching the input position Pi-1, the mechanical control unit 30 generates the second control signal C2-1 corresponding to the button 32-1 of the input position Pi-1, and at this time, the output control unit 50 receives the second control signal C2-1 in 1 second after receiving the first control signal C1-1. Therefore, the output control unit 50 outputs the second control signal C2-1 to control the system operation, e.g., actions of displaying words, signs, or numerals, moving the pointer, or executing the confirmation of the electronic device 100. On the contrary, if the finger does not press downwardly after touching the input position Pi-1, the output control unit 50 only receives the first control signal C1-1 corresponding to the input position Pi-1 in 1 second, i.e., the output control unit 50 does not receive the second control signal C2-1 corresponding to the same input position Pi-1 in 1 second after receiving the first control signal C1-1. Therefore, the output control unit 50 outputs the first control signal C1-1 to control the system operation of the electronic device 100.

Referring to FIG. 1A, the output control unit 50 may be implemented by a single signal processing circuit. The signal processing circuit includes a diction circuit 52 and an output valve 54. The detection circuit 52 is electrically connected to the touch control unit 10 and the mechanical control unit 30, and an output end of the detection circuit 52 is electrically connected to the output valve 54. The output valve 54 selectively outputs the first control signal C1 and the second control signal C2 corresponding to the same input position Pi. The detection circuit 52 receives and transfers the first control signal C1 and the second control signal C2, and confirms the reception of the first control signal C1 and the second control signal C2 corresponding to the same input position Pi according to the time parameter, so as to control the output valve 54 to output the first control signal C1 or the second control signal C2 corresponding to the same input position Pi.

In other words, the control signal (i.e. the first control signal C1 and the second control signal C2 in this embodiment) includes an executive instruction for controlling the system operation and coordinate information indicating the corresponding input position Pi. Therefore, the output control unit 50 detects the coordinate information in the control signal through the detection circuit 52 to get the corresponding input position Pi, thus confirming the reception of the control signal (i.e. the first control signal C1 and the second control signal C2 in this embodiment) according to the time parameter to determine the control signal (i.e. the first control signal C1 and the second control signal C2 in this embodiment) output by the output valve 54. Here, the output valve 54 may be implemented by a multiplexer.

Referring to FIG. 1B, the output unit 50 also includes one or more sub-control unit(s) 56 (i.e. the generally name of sub-control units 56-1, 56-2 . . . 56-n in this embodiment). Each sub-control unit 56 controls the output of the first control signal C1 or the second control signal C2 of the input position Pi according to the time parameter.

Figure 3:
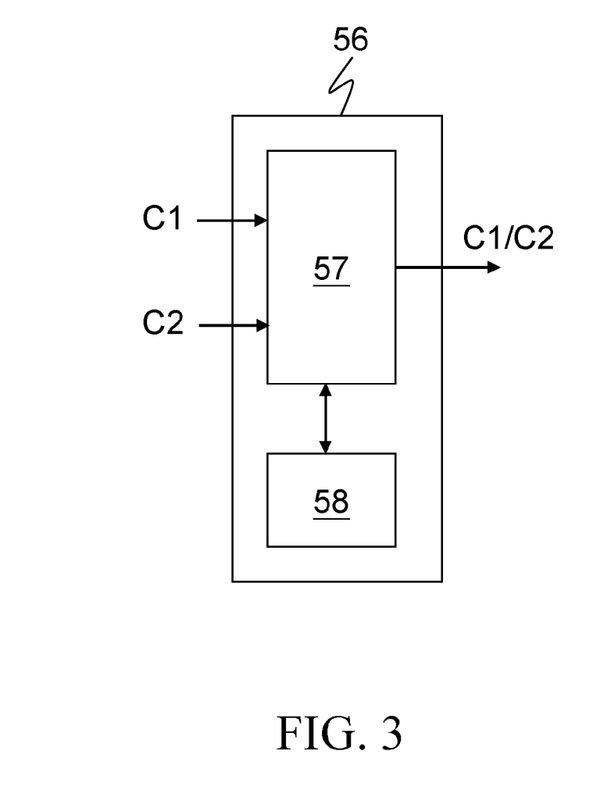
FIG. 3 is a brief schematic view of a sub-control unit according to an embodiment of FIG. 1B.

Referring to FIG. 3, each sub-control unit 56 includes an output valve 57 and a counter 58. The output valve 57 is electrically connected to the touch control unit 10 and the mechanical control unit 30, and a control end of the output valve 57 is electrically connected to the counter 58. The output valve 57 receives the first control signal C1 and the second control signal C2 corresponding to the same input position Pi. The counter 58 counts the time parameter when the output valve 57 receives the first control signal C1. When the counter 58 counts the time parameter, the output valve 57 outputs the received second control signal C2, and when outputting the second control signal C2, the counter 58 stops counting. After the counter 58 completes counting the time parameter, the output valve 58 outputs the received first control signal C1.

Figures 4, 5:
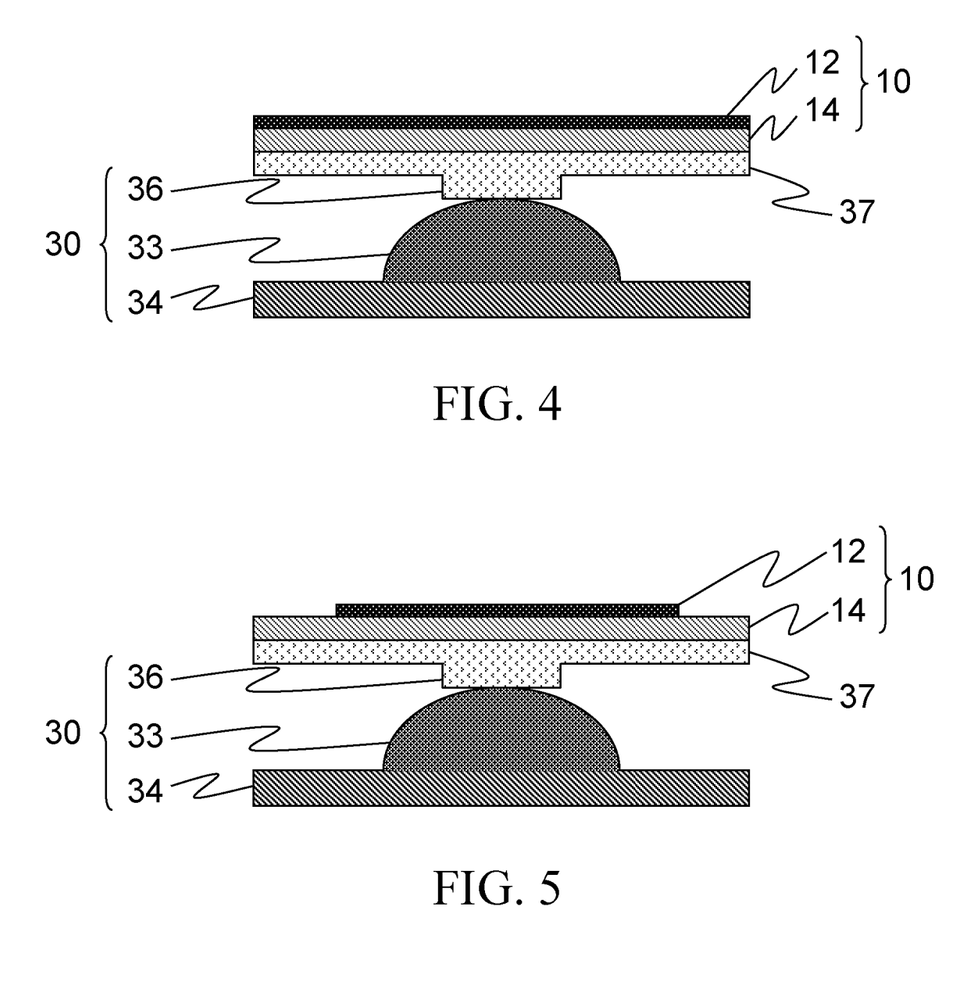
FIG. 4 is brief cross-sectional view of a touch control unit and a mechanical control unit of a first embodiment taken along line I-I in FIG. 2.
FIG. 5 is brief cross-sectional view of a touch control unit and a mechanical control unit of a second embodiment taken along line I-I in FIG. 2.
Figure 7:
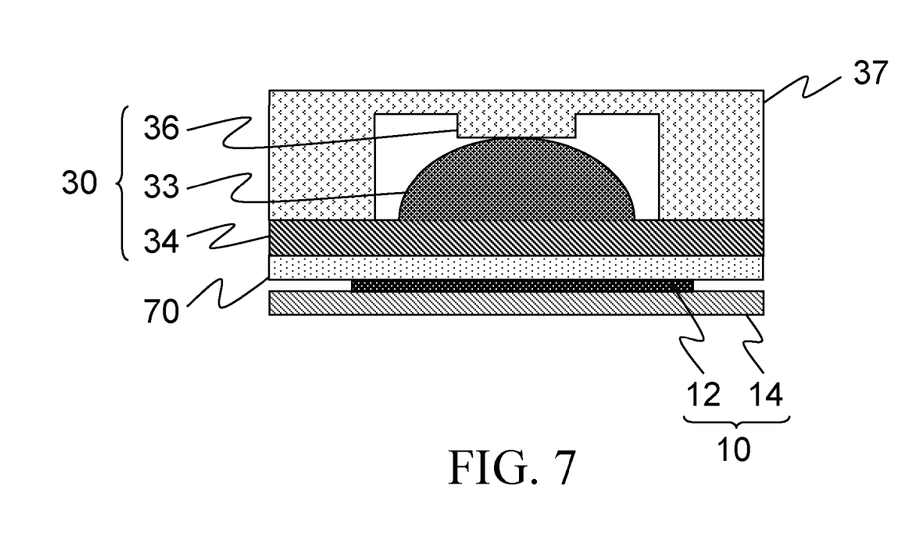
FIG. 7 is brief cross-sectional view of a touch control unit and a mechanical control unit of a fourth embodiment taken along line I-I in FIG. 2.

Referring FIGS. 4, 5, 5, and 7, the touch control unit 10 includes a sensing circuit 12, e.g., a capacitive sensing circuit, a resistive sensing circuit, an optical sensing circuit, or a sonic sensing circuit, and preferably the capacitive sensing circuit. The sensing circuit 12 is disposed on a substrate 14, and preferably disposed on a flexible printed circuit (FPC).

The mechanical control unit 30 includes one or more metal dome(s) 33. The metal dome(s) 33 is(are) corresponding to the input position Pi respectively and is(are) disposed on a substrate 34 (for example, a circuit board) to form one or more button(s) 32. Each metal dome 33 has an insulation pad 36 disposed thereabove. The corresponding metal dome 33 below is touched by pressing the insulation pad 36. Herein, the insulation pads 36 may be made of rubber. All the insulation pads 36 are integrally formed on an insulation sheet, for example, an insulation sheet 37 having at least one protrusion (i.e., the insulation pad 36).

Herein, the touch control unit 10 is disposed on the mechanical control unit 30, as shown in FIGS. 4 and 5. The touch control unit 10 is insulated from the metal dome 33 by the insulation pad 36 and/or the insulation sheet 37 of the mechanical control unit 30.

Figure 6:
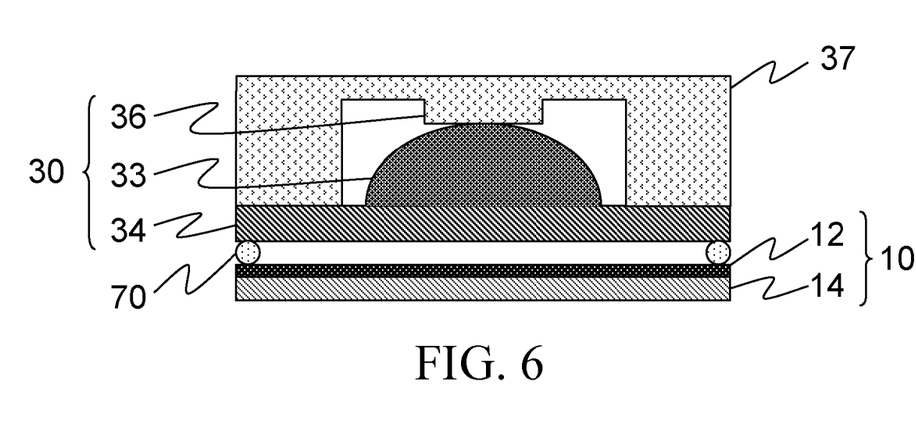
FIG. 6 is brief cross-sectional view of a touch control unit and a mechanical control unit of a third embodiment taken along line I-I in FIG. 2.

However, the touch control unit 10 may also be disposed under the mechanical control unit 30, as shown in FIGS. 6 and 7. Here, the touch control unit 10 and the mechanical control unit 30 are separated by an insulation spacer 70.

Figure 8:
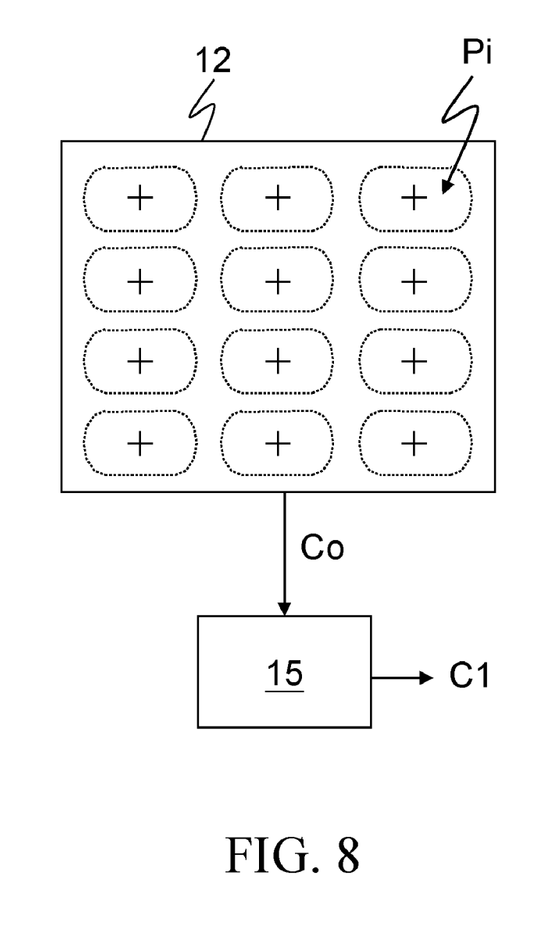
FIG. 8 is a brief schematic view of an embodiment of a touch control unit according to the input device for a multiplex control signal of the present invention.

Referring to FIGS. 4, 6, and 8, the sensing circuit 12 in the touch control unit 10 generates a coordinate signal Co corresponding to each input position Pi, and generates the corresponding first control signal C1 after the algorithm processing of a processing circuit 15. The processing circuit 15 can be designed on the substrate 14.

Figure 9:
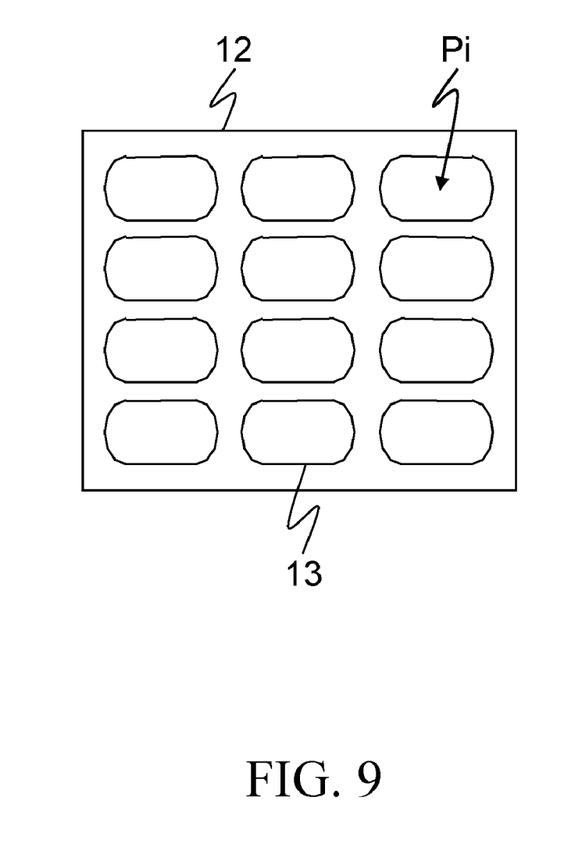
FIG. 9 is a brief schematic view of another embodiment of a touch control unit according to the input device for a multiplex control signal of the present invention.

Referring to FIGS. 5, 7, and 9, the sensing circuit 12 in the touch control unit 10 includes one or more touch area(s) 13. Each touch area 13 is corresponding to one input position Pi. In other words, a touch area 13 is formed only at a site corresponding to each input position. The touch area 13 in the sensing circuit 12 generates the first control signal C1 corresponding to the touch state of the corresponding input position Pi.

Figure 10:
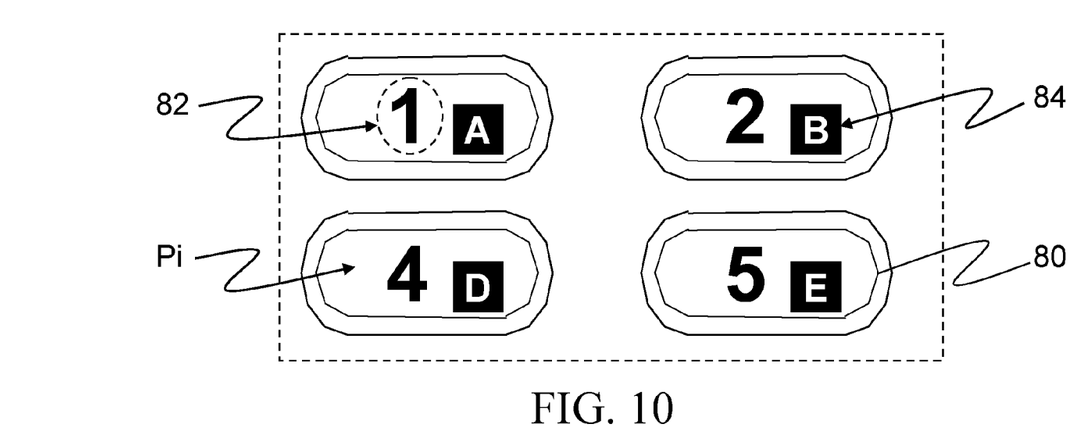
FIG. 10 is a partial enlarged view showing an appearance of the input device for a multiplex control signal according to an embodiment of the present invention.
Figure 11:
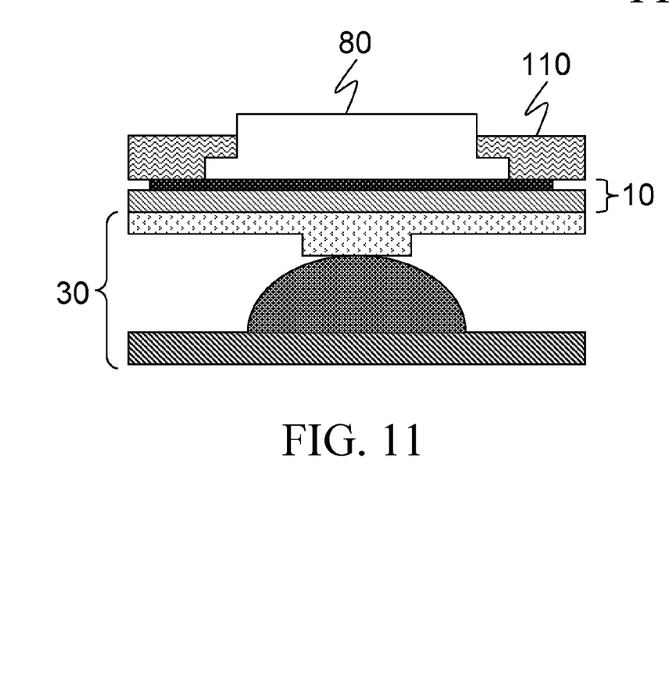
FIG. 11 is brief cross-sectional view of a touch control unit and a mechanical control unit of a fifth embodiment taken along line I-I in FIG. 2.
Figure 12:
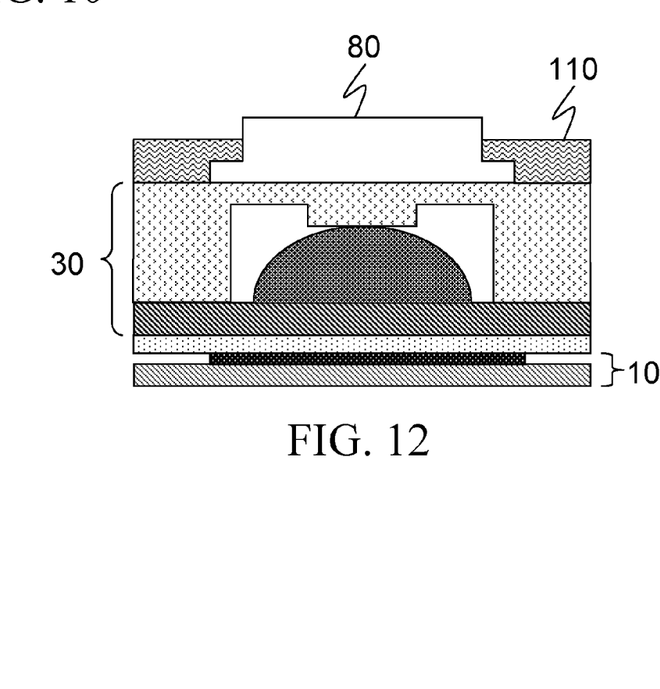
FIG. 12 is brief cross-sectional view of a touch control unit and a mechanical control unit of a sixth embodiment taken along line I-I in FIG. 2.
Figure 13:
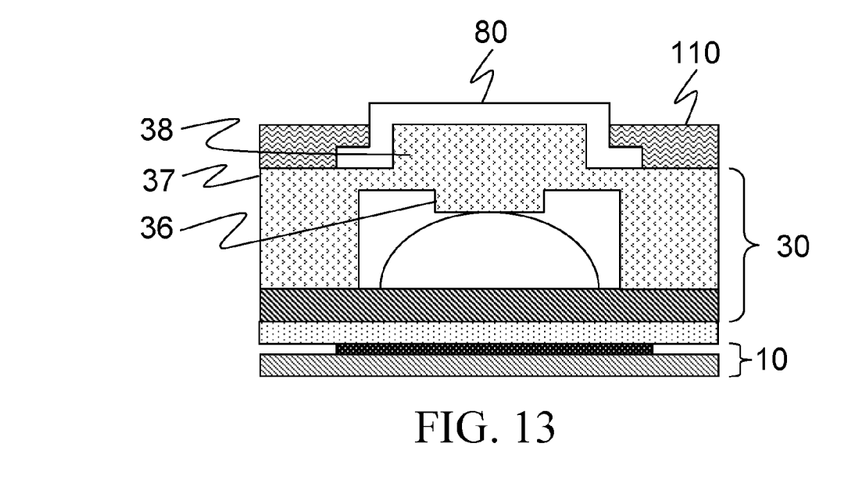
FIG. 13 is schematic cross-sectional view of a touch control unit and a mechanical control unit of a seventh embodiment taken along line I-I in FIG. 2.

Herein, referring to FIGS. 1A, 2, 10, 11, 12, and 13, an external indication unit 80 is disposed on the control unit (i.e., the touch control unit 10 or the mechanical control unit 30). Each external indication unit 80 is corresponding to one input position Pi, and the external indication unit 80 indicates the control action of the first control signal C1 and the second control signal C2 corresponding to the same input position Pi. Each external indication unit 80 has indication marks thereon corresponding to the control signal. In this embodiment, each external indication unit 80 has a first indication mark 82 and a second indication mark 84 thereon. The first indication mark 82 indicates the control action corresponding to the first control signal C1 of the corresponding input position Pi (i.e., marking the control action of the control signal generated by the touch control unit 10 at the position where the external indication unit 80 is located) of the user. The second indication mark 84 indicates the control action corresponding to the second control signal C2 of the corresponding input position Pi (i.e., marking the control action generated by the mechanical control unit 30 at the position where the external indication unit 80 is located) of the user. Accordingly, the first indication mark 82 and the second indication mark 84 are as shown in FIG. 10, and may be exhibited in different visual displays or in the same visual display (not shown). Further, the marking position of the first indication mark 82 and the second marking position 84 may also be exchanged.

The external indication unit 80 can be a keycap. Furthermore, when the external indication unit 80, the mechanical control unit 30, and the touch control unit 10 are overlapped in sequence, the insulation sheet 37 has a protrusion 38 corresponding to the other side of the insulation pad 36. When the keycap serves as the external indication unit 80, the keycap is fitted on the protrusion 38 to expose the surface of the external indication unit 80 according to the used electronic device, so as to maintain the horizontal position of the external indication unit 80.

Further, referring to FIGS. 1A, 14, 15, 16, and 17, an external indication thin plate 90 may also be disposed on the control unit (i.e., the touch control unit 10 or the mechanical control unit 30), so as to provide the control action (i.e. control the execution action of the system of the used electronic device) of the control unit corresponding to the input position of the user. The external indication thin plate 90 is overlapped above the touch control unit 10 and the mechanical control unit 30 at the input position Pi. The external indication thin plate 90 has one or more indication area(s) 91 thereon. Each indication area 91 is corresponding to an input position Pi. Here, the indication area 91 has words and signs marked thereon to indicate the control action of the first control signal C1 and the second control signal C2 of the input position Pi corresponding to the indication area 91 (i.e., the control action of the first control signal C1 and the second control signal C2 generated by the touch control unit 10 and the mechanical control unit 30 at the position where the indication area 91 is located) of the user.

Figure 14:
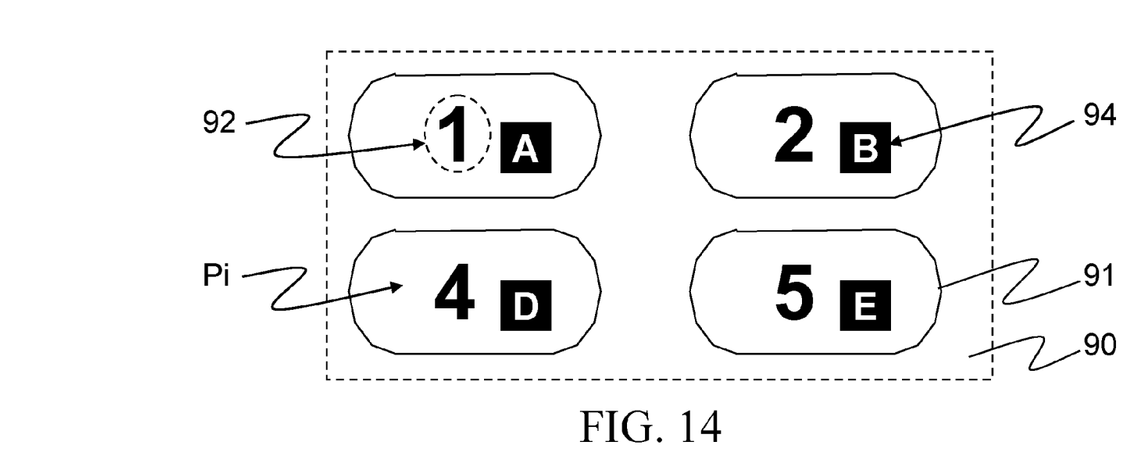
FIG. 14 is a partial enlarged view showing an appearance of the input device for a multiplex control signal according to another embodiment of the present invention.
Figure 15:
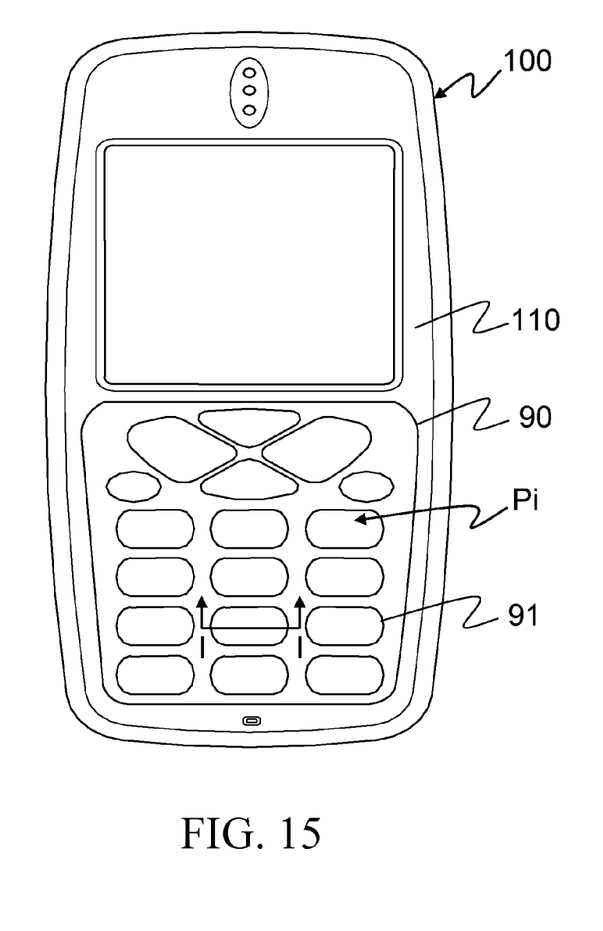
FIG. 15 is a schematic view showing an appearance of an electronic device adopting the input device for a multiplex control signal according to another embodiment of the present invention.
Figure 16:
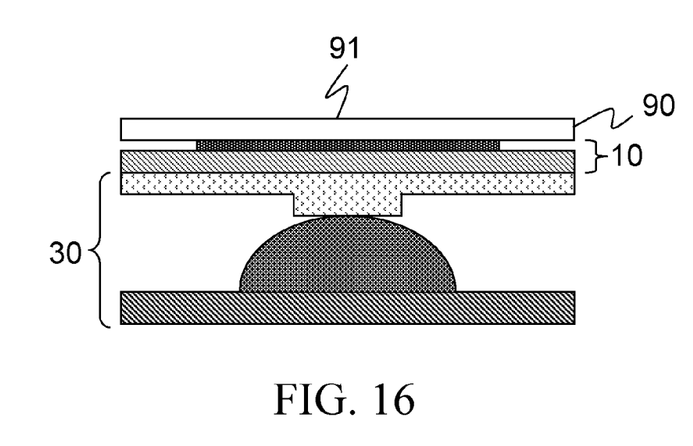
FIG. 16 is brief cross-sectional view of a touch control unit and a mechanical control unit of a first embodiment taken along line I-I in FIG. 15.
Figure 17:
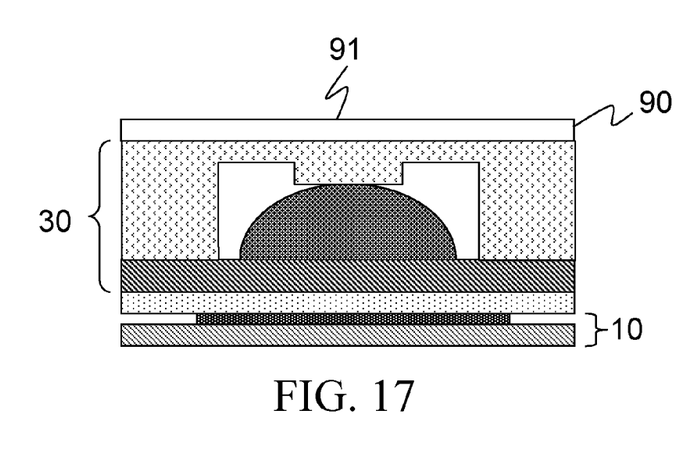
FIG. 17 is brief cross-sectional view of a touch control unit and a mechanical control unit of a second embodiment taken along line I-I in FIG. 15.

Each indication area 91 has indication mark marked thereon corresponding to the control signal. In this embodiment, each indication area 91 has a first indication mark 92 and a second indication mark 94 thereon. The first indication mark 92 indicates the control action corresponding to the first control signal C1 of the corresponding input position Pi (i.e., marking the control action of the control signal generated by the touch control unit 10 at the position where the external indication unit 91 is located) of the user, and the second indication mark 94 indicates the control action corresponding to the second control signal C2 of the corresponding input position Pi (i.e., marking the control action generated by the mechanical control unit 30 at the position where the external indication unit 91 is located) of the user. Accordingly, the first indication mark 92 and the second indication mark 94 are shown in FIG. 14, and may be exhibited in different visual displays or the same visual display (not shown). Further, the marking position of the first indication mark 92 and the second marking position 94 may also be exchanged.

Figure 18:
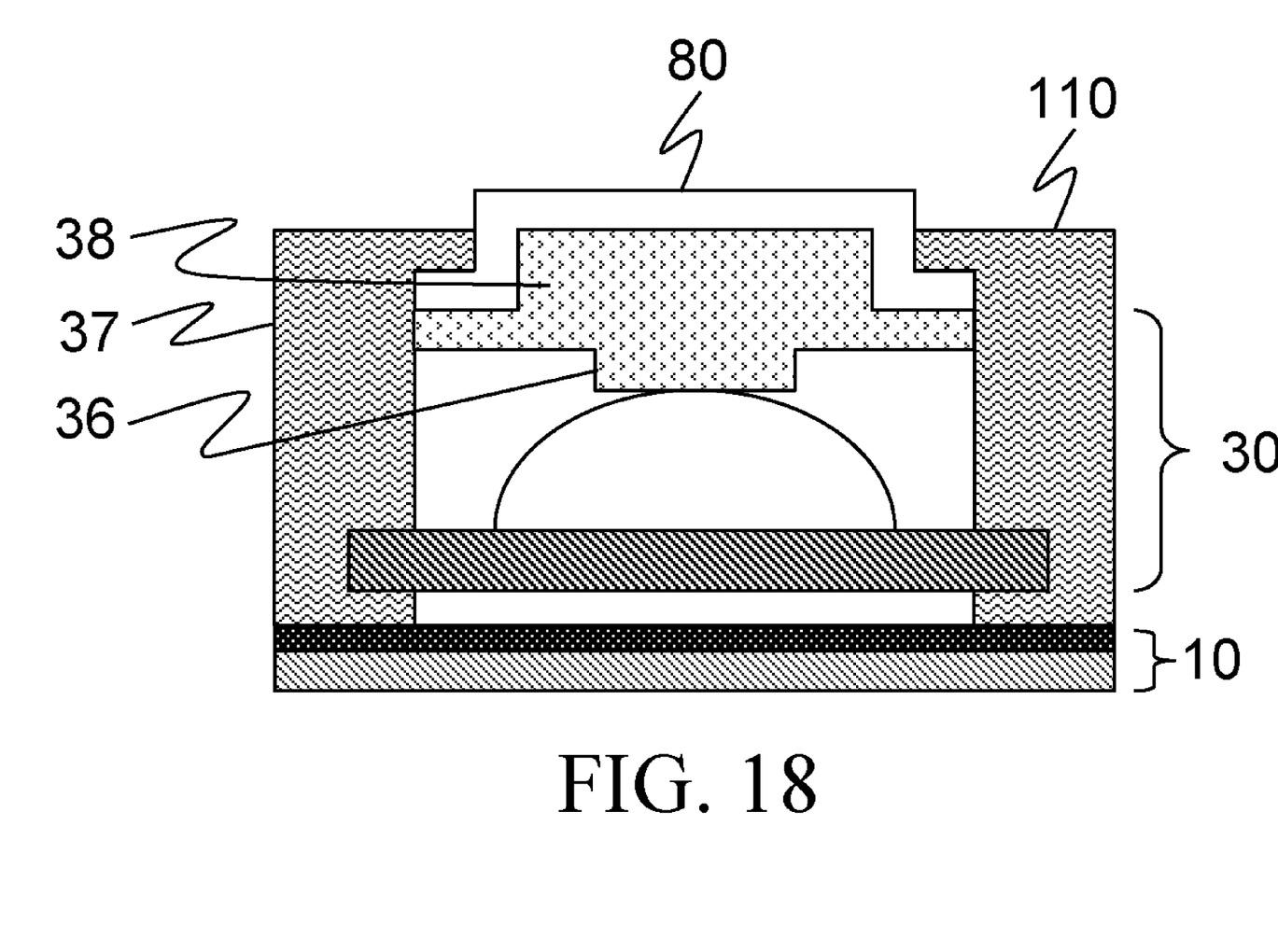
FIG. 18 is brief cross-sectional view of a touch control unit and a mechanical control unit of an eighth embodiment taken along line I-I in FIG. 2.

Then, referring to FIGS. 2, 4-7, 11-13, and 15-17, the touch control unit 10 contacts the elements between a casing 110 of the electronic device 100 adopting the input device for a multiplex control signal of the present invention to form an insulation path for electrostatic transmission between the casing 110 of the electronic device 100 and the sensing circuit 12 of the touch control unit 10, such that the touch control unit 10 can actually sense the touch on the corresponding input position (for example, but not limited to, the touch control unit 10 can actually sense the external indication unit 80 or the casing 100 at the corresponding position touched by the user). In other words, when the touch control unit 10 is disposed above the mechanical control unit 30, the sensing circuit 12 of the touch control unit 10 contacts the external indication unit 80 or the external indication thin plate 90 thereabove, and even contacts the casing 110 of the electronic device 100 at the corresponding position (i.e., the corresponding input position). When the touch control unit 10 is disposed under the mechanical control unit 30, the external indication unit 80 or the external indication thin plate 90, the mechanical control unit 30, and the touch control unit 10 are in contact with one another in sequence. For example, the external indication unit 80 or the external indication thin plate 90, the insulation sheet 37, the substrate 34, the insulation spacer 70, and the sensing circuit 12 are in contact with one another in sequence. Furthermore, the casing 110 of the electronic device 100 at the corresponding position (i.e., the corresponding input position) can be designed to be in contact with the elements (such as the insulation sheet 37) therebelow, thus forming an electrostatic transmission path constituted by an insulation material between the casing 110 of the electronic device 100 and the sensing circuit 12. Further, the casing 110 of the electronic device 100 at the corresponding position (i.e., the corresponding input position) can also be designed to be in direct contact with the sensing circuit 12 therebelow, as shown in FIG. 18. Further, the insulation sheet 37 may also be directly connected to the substrate 34 through other insulating supporting members. The supporting member can support the insulation sheet 37 on the substrate 34, or form an insulating electrostatic transmission path between the insulation sheet 37 and the substrate 34. Preferably, the supporting member is formed by an elastic insulating material.

In view of the above, the input device for a multiplex control signal of the present invention generates a plurality of control signals corresponding to one or more input position(s) respectively, and each input position generates a plurality of control signals corresponding to the input state. In other words, the input device for a multiplex control signal of the present invention can respond a single press and generate one or more signal(s) according to the input state. Therefore, the user can control the extent of pressing as required, so as to achieve the input of different signals. In this manner, when the variation of the control action of each input button increases, the complexity of the input operation and the system will not increase, and the input speed of the user is increased.

What is claimed is:

1. An input device for a multiplex control signal, comprising:
   a touch control unit, for generating one or more first control signal(s) corresponding to a touch state of one or more input position(s);
   a mechanical control unit, overlapped with the touch control unit at the input position(s), having one or more button(s), the button(s) corresponding to the input position(s) respectively, each of the button for generating a second control signal corresponding to a press state of the corresponding input position; and
   an output control unit, electrically connected to the touch control unit and the mechanical control unit, for determining output of the first control signal and the second control signal from the same input position according to a time parameter;
   wherein when the output control unit receives the first control signal and the second control from the same input position within the time parameter, the output control unit outputs the received second control signal; when the output control unit merely receives the first control signal from the same input position within the time parameter, the output control unit outputs the received first control signal.

2. The input device for a multiplex control signal as claimed in claim 1, wherein the touch control unit comprises one or more touch area(s), the touch area(s) corresponding to the input position(s) respectively, each the touch area for generating the first control signal corresponding to the touch state of the corresponding input position.

3. The input device for a multiplex control signal as claimed in claim 1, wherein the touch control unit is disposed on the mechanical control unit.

4. The input device for a multiplex control signal as claimed in claim 1, wherein the touch control unit is disposed under the mechanical control unit.

5. The input device for a multiplex control signal as claimed in claim 1, further comprising:
   one or more external indication unit(s), corresponding to the input position(s) respectively, each for indicating control actions of the first control signal and the second control signal corresponding to the same input position.

6. The input device for a multiplex control signal as claimed in claim 5, wherein each the external indication unit has a first indication mark and a second indication mark marked thereon, the first indication mark indicates the control action corresponding to the first control signal of the corresponding input position, and the second indication mark indicates the control action corresponding to the second control signal of the corresponding input position.

7. The input device for a multiplex control signal as claimed in claim 1, wherein the output control unit comprises one or more sub-control unit(s), each sub-control unit controls the output of the first control signal and the second control signal in response to the same one of the input position(s) according to the time parameter.

8. The input device for a multiplex control signal as claimed in claim 7, wherein each sub-control unit further comprises: an output valve, for receiving the first control signal and the second control signal corresponding to the same input position; and a counter, for counting the time parameter when the output valve receives the first control signal; wherein during the counter counts the time parameter, the output valve outputs the received second control signal, and when the second control signal is output, the counter stops counting; and after the counter completes counting the time parameter, the output valve outputs the received first control signal.

9. The input device for a multiplex control signal as claimed in claim 1, wherein the output control unit is a signal processing circuit, and the signal processing circuit comprises: an output valve, for selectively output the first control signal and the second control signal corresponding to the same input position; and a detection circuit, for receiving and transferring the first control signal and the second control signal, and confirming the reception of the first control signal and the second control signal corresponding to the same input position according to the time parameter, so as to control the output valve to output one of the first control signal and the second control signal corresponding to the same input position.

10. An input device for a multiplex control signal, comprising:
   a touch control unit, for generating one or more first control signal(s) corresponding to a touch state of one or more input position(s);
   a mechanical control unit, overlapped with the touch control unit at the input position(s), having one or more button(s), the button(s) corresponding to the input position(s) respectively, each of the button for generating a second control signal corresponding to a press state of the corresponding input position;
   an output control unit, electrically connected to the touch control unit and the mechanical control unit, for determining output of the first control signal and the second control signal from the same input position according to a time parameter; and
   one or more external indication unit(s), corresponding to the input position(s) respectively, each of the external indication unit(s) for indicating control actions of the first control signal and the second control signal corresponding to the same input position.

11. The input device for a multiplex control signal as claimed in claim 10, wherein each the external indication unit has a first indication mark and a second indication mark marked thereon, the first indication mark indicates the control action corresponding to the first control signal of the corresponding input position, and the second indication mark indicates the control action corresponding to the second control signal of the corresponding input position.

12. An input device for a multiplex control signal, comprising:
   a touch control unit, for generating one or more first control signal(s) corresponding to a touch state of one or more input position(s);
   a mechanical control unit, overlapped with the touch control unit at the input position(s), having one or more button(s), the button(s) corresponding to the input position(s) respectively, each of the button for generating a second control signal corresponding to a press state of the corresponding input position;
   an output control unit, electrically connected to the touch control unit and the mechanical control unit, for determining output of the first control signal and the second control signal from the same input position according to a time parameter; the output control unit comprising one or more sub-control unit(s), each sub-control unit controlling the output of the first control signal and the second control signal in response to the same one of the input position(s) according to the time parameter.

13. The input device for a multiplex control signal as claimed in claim 12, wherein each sub-control unit further comprises: an output valve, for receiving the first control signal and the second control signal corresponding to the same input position; and a counter, for counting the time parameter when the output valve receives the first control signal; wherein during the counter counts the time parameter, the output valve outputs the received second control signal, and when the second control signal is output, the counter stops counting; and after the counter completes counting the time parameter, the output valve outputs the received first control signal.

* * * * *